United States Patent
Benecke et al.

[11] Patent Number: 5,533,675
[45] Date of Patent: * Jul. 9, 1996

[54] APPARATUS FOR APPLYING DISCRETE COATINGS

[75] Inventors: Jurgen Benecke, Brandenburger; Arthur Cieplik, Luneburg; Thomas Burmester, Bleckede, all of Germany

[73] Assignee: Nordson Corporation, Westlake, Ohio

[ * ] Notice: The term of this patent shall not extend beyond the expiration date of Pat. No. 5,354,378.

[21] Appl. No.: 450,234

[22] Filed: May 25, 1995

Related U.S. Application Data

[62] Division of Ser. No. 224,426, Apr. 8, 1994, Pat. No. 5,423,935, which is a continuation of Ser. No. 910,781, Jul. 8, 1992, abandoned.

[51] Int. Cl.$^6$ ................. B05B 7/16; B05B 7/00
[52] U.S. Cl. ..................... 239/413; 239/424.5
[58] Field of Search .................... 239/296, 297, 239/299, 412, 413, 424.5, 424, 423, 418, 429, 433, 568, 549, 553, 553.5, 563, 562; 425/7, 72.2, 382.2

[56] References Cited

U.S. PATENT DOCUMENTS

| | | | |
|---|---|---|---|
| Re. 33,481 | 12/1990 | Ziecker et al. | 239/298 |
| 999,789 | 8/1911 | Hussy . | |
| 3,199,787 | 8/1965 | James | 239/423 |
| 3,578,527 | 5/1971 | Sakata et al. | 156/244 |
| 3,595,204 | 7/1971 | McIntyre | 239/70 |
| 3,806,289 | 4/1974 | Schwarz | 425/72 |
| 3,825,379 | 7/1974 | Lohkamp et al. | 425/72 |
| 3,953,626 | 4/1976 | Suzuki et al. | 427/346 |
| 3,972,759 | 8/1976 | Buntin | 156/167 |
| 4,011,122 | 3/1977 | Ashcroft | 156/86 |
| 4,047,861 | 9/1977 | Balaz | 425/7 |
| 4,059,714 | 11/1977 | Scholl et al. | 428/310 |
| 4,081,301 | 3/1978 | Buell | 156/291 |
| 4,128,667 | 12/1978 | Timson | 427/348 |
| 4,133,970 | 1/1979 | Lusk | 174/19 |
| 4,156,398 | 5/1979 | McDaniel | 118/313 |
| 4,247,581 | 1/1981 | Cobbs, Jr. et al. | 427/373 |
| 4,377,985 | 3/1983 | Reba | 239/433 |
| 4,408,562 | 10/1983 | Decamp et al. | 118/324 |
| 4,476,165 | 10/1984 | McIntyre | 427/258 |
| 4,478,631 | 10/1988 | Cobbs, Jr. et al. | 261/128 |
| 4,553,701 | 11/1985 | Rehman et al. | 239/432 |
| 4,687,137 | 8/1987 | Boger et al. | 239/124 |
| 4,711,683 | 12/1987 | Merkatoris | 239/297 |
| 4,714,647 | 12/1987 | Shipp, Jr. et al. | 428/212 |
| 4,720,252 | 1/1988 | Appel et al. | 425/4614 |
| 4,735,169 | 4/1988 | Cawston et al. | 118/411 |

(List continued on next page.)

FOREIGN PATENT DOCUMENTS

| | | | |
|---|---|---|---|
| 329813 | 8/1989 | European Pat. Off. . | |
| 1100463 | 12/1989 | European Pat. Off. . | |
| 2824403 | 12/1979 | Germany . | |
| 727237 | 4/1980 | U.S.S.R. | 239/297 |
| 1060237 | 12/1983 | U.S.S.R. | 239/297 |

OTHER PUBLICATIONS

"The Waistband Phenomenon" article; no date.

*Primary Examiner*—Andres Kashnikow
*Assistant Examiner*—Lesley D. Morris
*Attorney, Agent, or Firm*—Wood, Herron & Evans

[57] ABSTRACT

Apparatus and methods for producing intermittent, discrete patterns of coating material, such as hot melt adhesive, onto discrete substrates or substrate areas, where the patterns have sharp, square leading and trailing edges, as well as side edges. A slot nozzle die has elongated air slots along the slot extrusion opening. In the operation of the apparatus, the air flow is initiated from both air slots prior to the initiation of the hot melt flow. Also, the air flow is continued beyond that point in time, when the hot melt flow ceases. The delays between the operations of the air flow and the hot melt flow are on the order of micro seconds. Coating weights down to 1 gram per square meter at about 350 meters per minute substrate speed are provided. Alternatively, the lead and lag air start and stop times on each side of the coating material are different to control the exact disposition of the square cut-on and square cut-off coating edge on the substrate.

20 Claims, 6 Drawing Sheets

U.S. PATENT DOCUMENTS

| | | | |
|---|---|---|---|
| 4,746,545 | 5/1988 | McIntyre | 427/176 |
| 4,750,956 | 6/1988 | Malachowski | 156/79 |
| 4,753,819 | 6/1988 | Shimada | 427/96 |
| 4,774,109 | 9/1988 | Hadzimihalis et al. | 427/286 |
| 4,815,660 | 3/1989 | Boger | 239/8 |
| 4,818,464 | 4/1989 | Lau | 264/510 |
| 4,822,640 | 4/1989 | Tuhkanen et al. | 427/211 |
| 4,836,440 | 6/1989 | French | 229/132 |
| 4,844,342 | 7/1989 | Foley | 239/70 |
| 4,860,514 | 7/1989 | Scholl et al. | 222/146.5 |
| 4,874,451 | 10/1989 | Boger et al. | 156/291 |
| 4,880,663 | 11/1989 | Shimada | 427/96 |
| 4,891,249 | 1/1990 | McIntyre | 427/421 |
| 4,894,277 | 1/1990 | Akasaki | 428/198 |
| 4,900,593 | 2/1990 | Krippl | 427/420 |
| 4,906,492 | 3/1990 | Groshens | 427/148 |
| 4,948,053 | 8/1990 | Hufgard | 239/296 |
| 4,954,059 | 9/1990 | Lee et al. | 239/296 |
| 4,957,783 | 9/1990 | Gabryszewski | 427/424 |
| 4,961,536 | 10/1990 | Correard | 239/296 |
| 4,983,109 | 1/1991 | Miller et al. | 425/7 |
| 4,983,424 | 1/1991 | Saidman et al. | 427/243 |
| 4,984,949 | 1/1991 | Reckziegel | 412/8 |
| 5,000,112 | 3/1991 | Rothen et al. | 118/411 |
| 5,012,980 | 5/1991 | Viannaay et al. | 239/423 |
| 5,016,812 | 5/1991 | Pedigrew | 239/132 |
| 5,080,569 | 1/1992 | Gubernick et al. | 425/7 |
| 5,145,689 | 9/1992 | Allen et al. | 425/72.2 |
| 5,209,410 | 5/1993 | Wichmann et al. | 239/568 |
| 5,236,641 | 8/1993 | Allen et al. | 425/66 |
| 5,260,003 | 11/1993 | Nyssen et al. | 425/7 |
| 5,269,670 | 12/1993 | Allen et al. | 425/72.2 |
| 5,286,182 | 2/1994 | Maeda et al. | 425/7 |
| 5,354,378 | 10/1994 | Hauser | 118/584 |
| 5,421,921 | 6/1995 | Gill et al. | 425/7 |

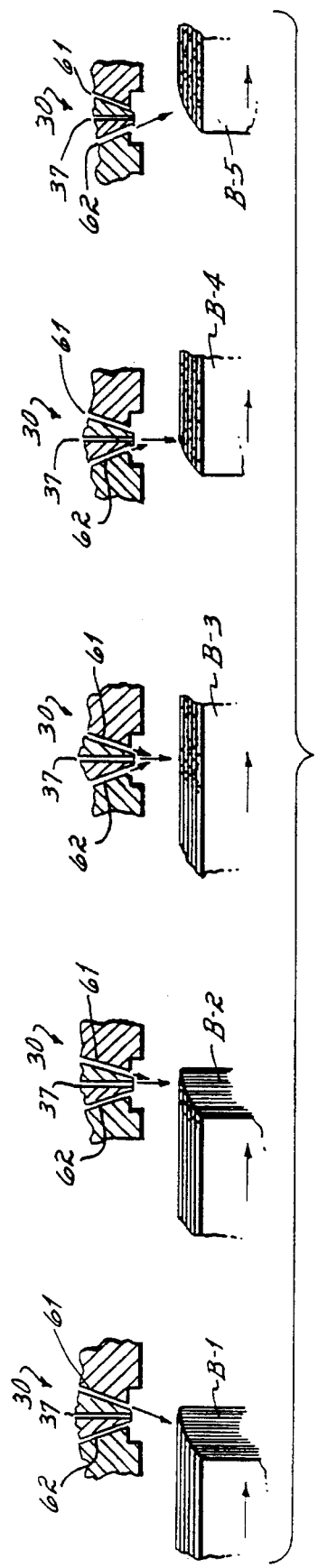
FIG. 5
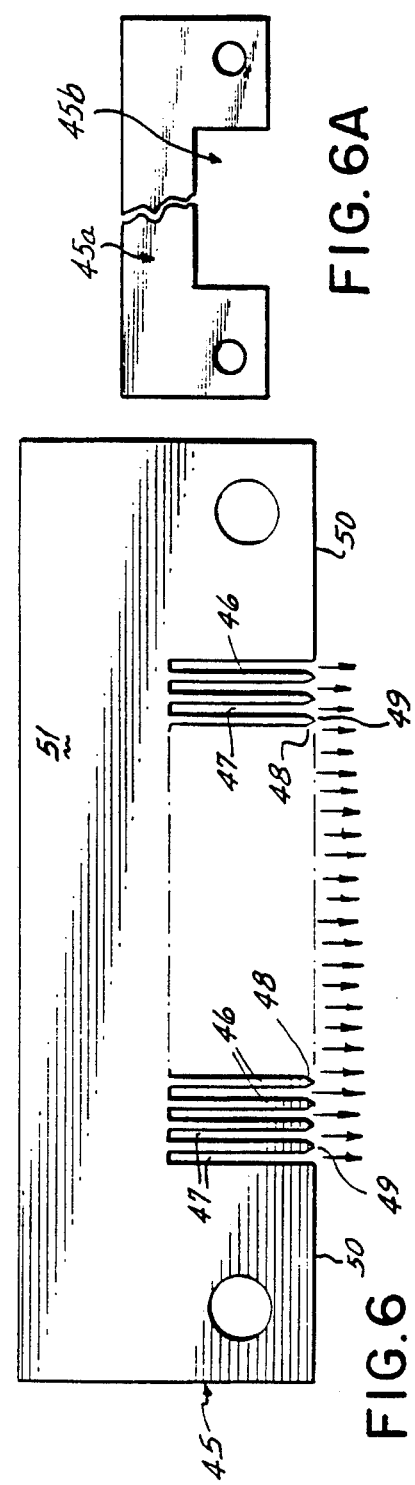
FIG. 6A
FIG. 6

APPARATUS FOR APPLYING DISCRETE COATINGS

This application is a divisional of application Ser. No. 08/224,426, filed Apr. 8, 1994, U.S. Pat. No. 5,423,935, which is a continuation of U.S. Ser. No. 07/910,781, filed Jul. 8, 1992, now abandoned.

This case is generally related to the following U.S. patent applications filed on even date herewith:

| Title | Inventors |
| --- | --- |
| Segmented Slot Die for Air Spray of Fibers Ser. No. 07/910,784 | M. Gill; J. Benecke; A. Cieplik; T. Burmester |
| Apparatus & Methods for Applying Discrete Foam Coatings Ser. No. 07/910,768 | J. Raterman; J. Benecke; A. Cieplik; T. Burmester; M. Gill |
| Methods & Apparatus for Applying Coatings to Bottles U.S. Pat. No. 5,354,378 | L. Hauser; J. Benecke; A. Cieplik; T. Burmester; M. Gill; K. Washington; R. Evans |
| Apparatus & Methods for Applying Conformal Coatings to Electronic Circuit Boards Ser. No. 07/910,782 | B. Boger; J. Benecke; A. Cieplik; T. Burmester; M. Gill |
| Apparatus & Methods for Intermittently Applying Discrete Adhesive Coatings Ser. No. 08/259,818 | J. Raterman; J. Benecke; A. Cieplik; T. Burmester; M. Gill |

Such applications are expressly incorporated herein by reference.

This invention relates to the application of coatings to substrates and more particularly to the application to substrates of discrete, uniform coatings having sharp, square cut-on and cut-off edges.

Many industrial applications require the use of discrete, well defined and uniform adhesive coatings applied to predetermined areas. Such coatings are very useful in varied lamination processes, such as book binding, for example, and in other coating operations such as conformal coatings on non-uniform substrates like electronic circuit boards, and in other applications as well.

In the production of discrete coatings and adhesives for lamination of discrete substrate areas, for example, it is desirable to obtain broad, uniform coatings in a non-contact application process with sharp, square, cut-on and cut-off edges with no stringing of material. None of the processes currently known are entirely suitable for this application.

Many various devices have been used to apply adhesives for lamination, including contact coaters, curtain coaters, spray coaters, and, more recently, fine line or spiral pattern application devices. Curtain coaters do not generally provide acceptable cut-on and cut-off performance. Also, they do produce unacceptable neck-in, causing thickening of applied coating at the edges, or "rail roading". Contact coaters present the inherent disadvantage of wear and substrate index and tension tolerances. The spray, fine line and spiral pattern applicators do not generally produce highly defined square edge cut-on and cut-off coating edges in a uniform broad coating, as are desired in a number of applications.

While not related to lamination applications generally, another technique used for producing fibers and non-woven webs is known as a melt-blowing process. One such example of the melt-blowing process is described in U.S. Pat. No. 4,720,252. In that device, hot melt thermoplastic material is extruded from a continuous slot opening and air is blown onto the extruding material from both sides of the slot opening to produce the desired webs. Such processes are used for web production, and do not generally concern themselves with intermittent operation to produce discrete coatings, nor with extruding adhesives for lamination applications.

Accordingly, it has been one objective of this invention to produce broad, uniform, hot melt adhesive coatings with sharp side edges and sharp, square leading and trailing edges on intermittently presented discrete substrate areas.

Another objective of this invention has been to provide methods and apparatus for intermittent non-contact application of thermoplastic coating material, having sharp and square side, leading and trailing edges, to discrete, predetermined areas.

Another objective of the invention has been to provide slot nozzle apparatus and methods for producing broad, uniform discrete coatings having sharp and square side, leading and trailing edges.

To these ends, a preferred embodiment of the invention includes a slot nozzle, elongated air channels on each side of the slot nozzle for impinging a flow of air on each side of an expanse of coating material extruding or emanating from the slot nozzle, and means for controlling the supply of material to the slot nozzle and the supply of air to the air channels so that each can be initiated and stopped at predetermined intervals to produce sharp, square leading and trailing edges in the deposited coatings.

In one mode, the air start-up on both sides precedes extrusion start-up and continues until after the extrusion is stopped. In another mode, the air on one side of the nozzle is started before extrusion is started and terminates before extrusion is stopped while air on another side of the nozzle starts at or after extrusion start-up and continues until after extrusion stops.

Continuation of air flow after extrusion stoppage can draw coating material remaining at or in the nozzle into the air stream and onto a substrate, causing stringing. Accordingly, the delay of air stoppage after extrusion stoppage is predetermined to produce good sharp, square coating pattern cut-off, but not so long as to draw remaining glue at the nozzle therefrom so as to cause stringing. The air start-up and stop delays are preferably on the order of microseconds.

The invention produces uniform, wide or broad coatings with no significant edge thickening, having sharp side edges and sharp, square, leading and trailing edges coordinated with a predetermined underlying substrate area and applied in a non-contacting application process.

These and other objectives and advantages will become readily apparent from the following detailed description of a preferred embodiment of the invention and from the drawings in which:

FIG. 5 is a diagrammatic view illustrating use of one embodiment of the invention in a book binding application;

FIG. 6 is a front view of the slotted or segmented shim used in the slot nozzle die of the invention;

FIG. 6A is a front view of an alternate "open" shim used in the slot nozzle die of the invention;

SPECIFICATION

Turning now to the drawings, there will now be described the apparatus for generating discrete, uniform coatings having sharp and square cut-on and cut-off edges. According to the invention, such coatings are either open, fibrous or porous coatings, or, on the other hand, are solid films. Moreover, such coatings can be formed from glue or adhesive materials, such as hot melt adhesives, or from cold glues, paints, or other materials of adhesive or non-adhesive nature. The invention will be described herein in terms of its use with hot melt adhesive.

Figure 1:
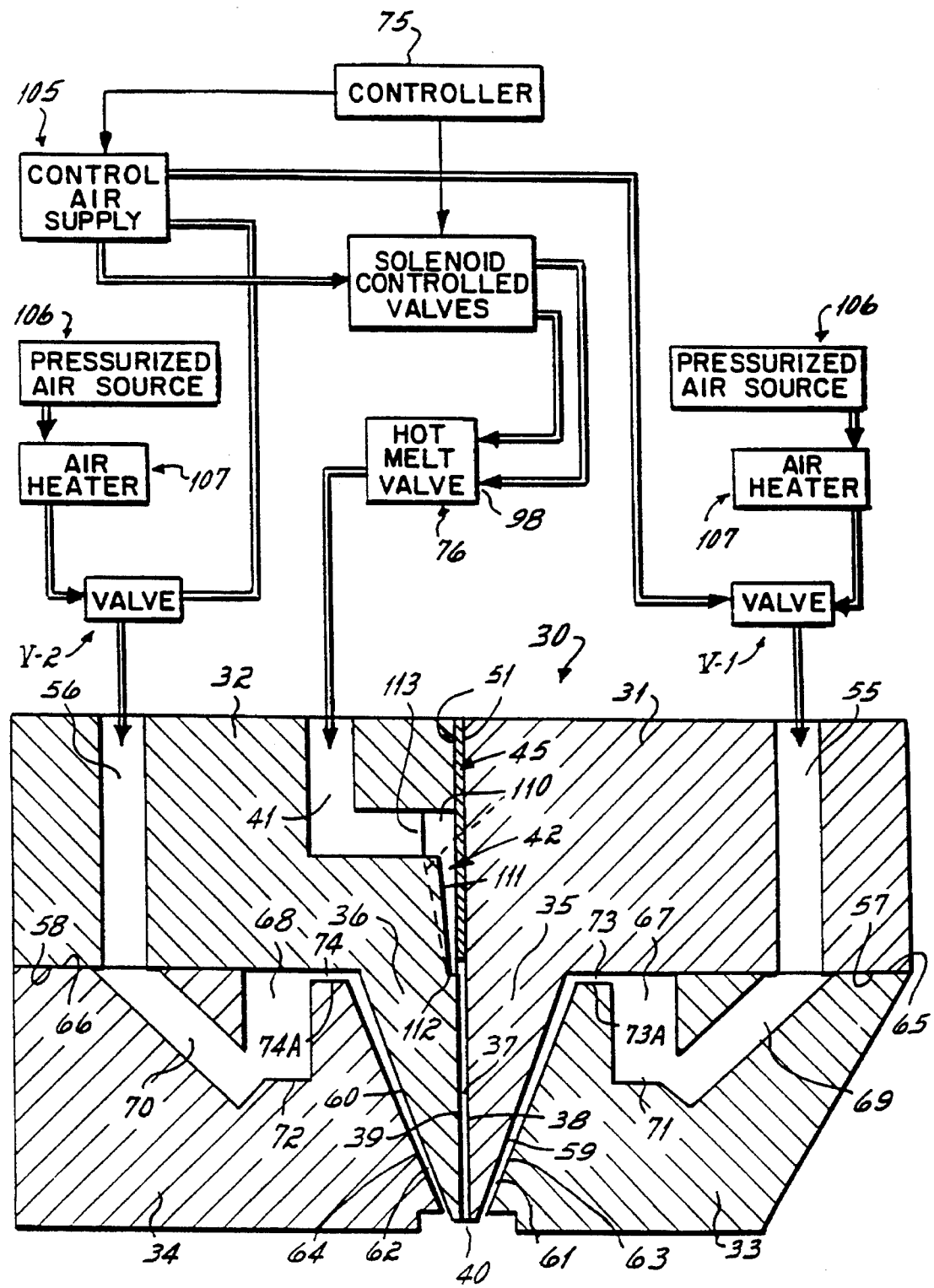
FIG. 1 is a diagrammatic side view in partial cross-section illustrating the invention.

FIG. 1 illustrates various features of a die means 30 and air and hot melt adhesive controls according to the invention. The die means 30 comprises two die halves 31, 32, and two air blocks 33, 34. Each die half 31, 32 includes a downwardly depending projection 35, 36. The die halves 31, 32 define between them an extrusion slot 37. Slot 37 is defined by the face 38 of the die half 31 and the face 39 of the die half 32. Face 38 is juxtaposed with respect to the face 39, as shown. The extrusion slot 37 terminates at an elongated slot or extrusion outlet 40. As noted in the Figures, the air blocks extend below the outlet 40 to provide a degree of protection from mechanical damage.

Figure 4:
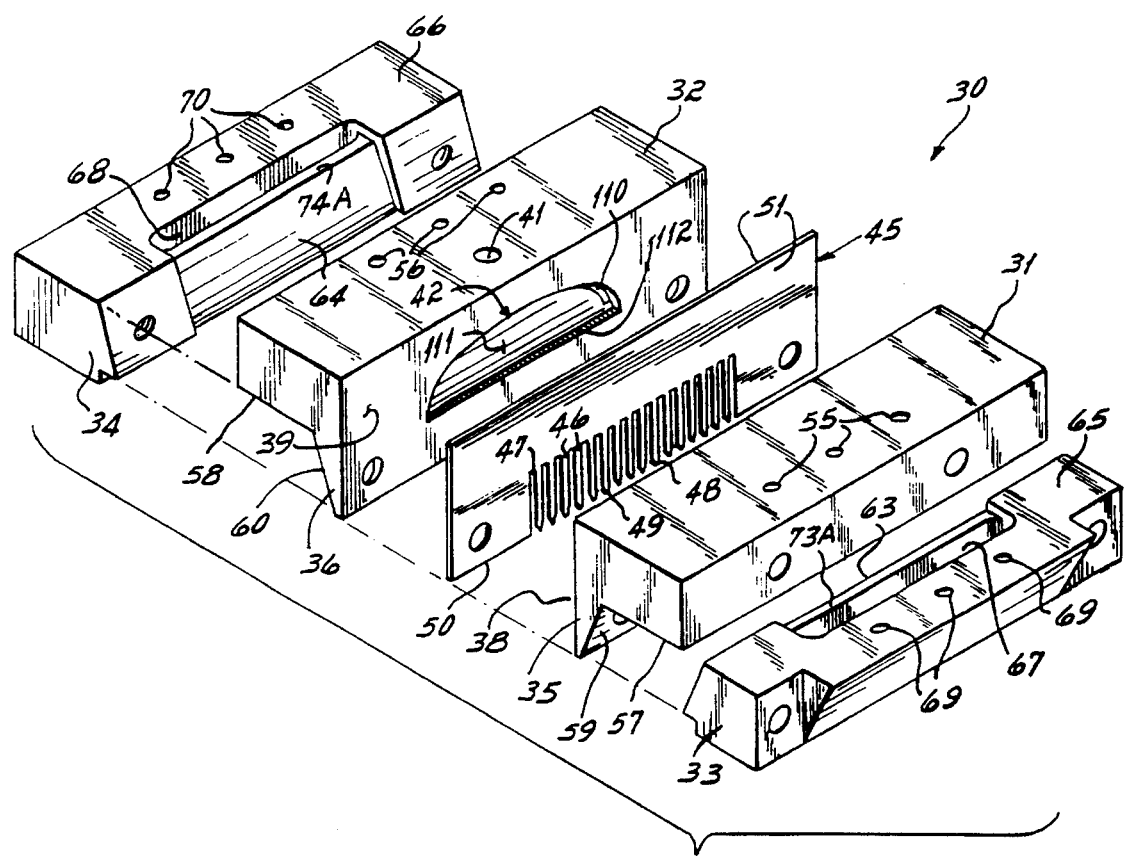
FIG. 4 is an exploded view of the slot nozzle die of FIG. 2.

Die half 32 includes a hot melt passageway 41 for receiving hot melt adhesive and conducting the hot melt adhesive to a "coat hanger" portion 42 of the die half 32, details of which are perhaps better seen in FIG. 4. A slotted or segmented shim 45, as best seen in FIG. 6, and a portion of which is seen in FIG. 1, is located between the juxtaposed surfaces 38 and 39 of the die halves 31 and 32. The shim 45 has a plurality of elongated projections 46, extending at least proximate to the slot outlet 40, defining between them a plurality of elongated channels or slots 47.

Each of the projections has a downstream tapered end portion 48, having a tip 49 which is just short of, flush with or just outwardly of the lower edge 50 of the shim, and just short of, flush with or just outwardly of the elongated slot nozzle extrusion outlet 40 (FIG. 1). In FIG. 1, only the top portion 51 of the shim 45 is shown, for the purpose of clarity. Alternatively, an open shim can be used. Such an open shim is depicted in FIG. 6A at 45a. This shim has an open area 45b, with no projection 46. Also, in another alternative, the tapered end portion 48 or tips 49 can extend beyond outlet 40, preferably two or three thousandths of an inch.

Returning now to FIG. 1, each of the upper die halves 31, 32 is provided with an air passageway 55, 56, extending from an upper surface of the die to a lower respective surface 57, 58. Each die half 31, 32 also includes an inclined surface 59, 60, depending from the surfaces 57 and 58, respectively. The inclined surfaces 59 and 60 define one part of an air passage, or elongated air slot 61 and 62, as will be described.

Turning now to the air blocks 33 and 34, it will be appreciated that each of them include an inclined surface 63 and 64, respectively, which define the other side of the air slots 61 and 62 with the juxtaposed respective surfaces 59, 60, all as shown in FIG. 1. Each of the air blocks 33 and 34 include an upper surface 65, 66 juxtaposed to the respective lower surfaces 57 and 58 of the die halves 31, 32.

An elongated air plenum 67, 68 is formed in each of the air blocks 33, 34. The plenums 67, 68 are also seen in FIG. 4. Respective air passages 69 and 70 are formed in the respective air blocks 33 and 34 and extend from the respective surfaces 65 and 66 to a lower portion 71, 72 of the respective plenums 67, 68. Each of the plenums 67, 68 are primarily defined in the air blocks 33 and 34. However, when the die means 30 are assembled, the top area of each of the respective plenums 67, 68 are defined respectively by the lower surfaces 57 and 58 of the die halves 31, 32. These surfaces 57, 58 also form an upper portion of air passage 73 and 74, each of which respectively lead from their associated plenums 67 and 68 to the air slots 61 and 62. Accordingly, looking at the right hand side of FIG. 1, it will be appreciated that air can pass through the passageway 55 to the passageway 69 in air block 33, and from there to the plenum 67. "O"-rings, not shown, can be used at the interfaces of the respective die half and air block to seal passageways 55, 56 with passageways 69, 70, respectively. Pressurized air in the plenum 67 moves through the passage 73 into the air slot 61.

In a like manner, air can be introduced to passageway 56 in the die half 32 and from there it can move into the air passage 70 and into the lower portion of the plenum 68. From the plenum 68, pressurized air is directed through the air passage 74 into the air slot 62 of the air block 34.

Referring now briefly to the upper portion of FIG. 1, it will be appreciated that a controller 75 is operationally connected to valves V-1 and V-2, as shown, for controlling the introduction of heated, pressurized air to the passageways 55 and 56, respectively, in order to pressurize those passageways and the downstream air passageways as previously described, with air. At the same time, the controller 75 is operationally interconnected to a hot melt control valve 76 for controlling the supply of coating material, such as hot melt adhesive, to the hot melt adhesive passageways 41 and to the internal coat hanger area 42 of the die means 30. While any suitable form of controller 75 can be used, as is well known, one particular controller comprises a PC-10 pattern controller, manufactured by Nordson Corporation of Westlake, Ohio. The PC-10 pattern control 75 is operational to initiate and to stop the generation of air into passageways 55 and 56, either simultaneously or independently, and also to initiate and to stop the hot melt flowing through valve 76 so as to intermittently provide coating material to the passageway 41 independently and at pre-selected times with respect to the provision of pressurized heated air to the passageways 55 and 56, all in a manner as will be described.

The air slots 61 and 62 are oriented on an angle with respect to the elongation of the extrusion slot 37. Accordingly, when coating material is extruded through the slot 37 and outwardly of the extrusion outlet 40, air moving through the air slots 61 and 62 is impinged on the material before that material engages or is deposited on an underlying substrate which is presented for coating.

Figure 2:
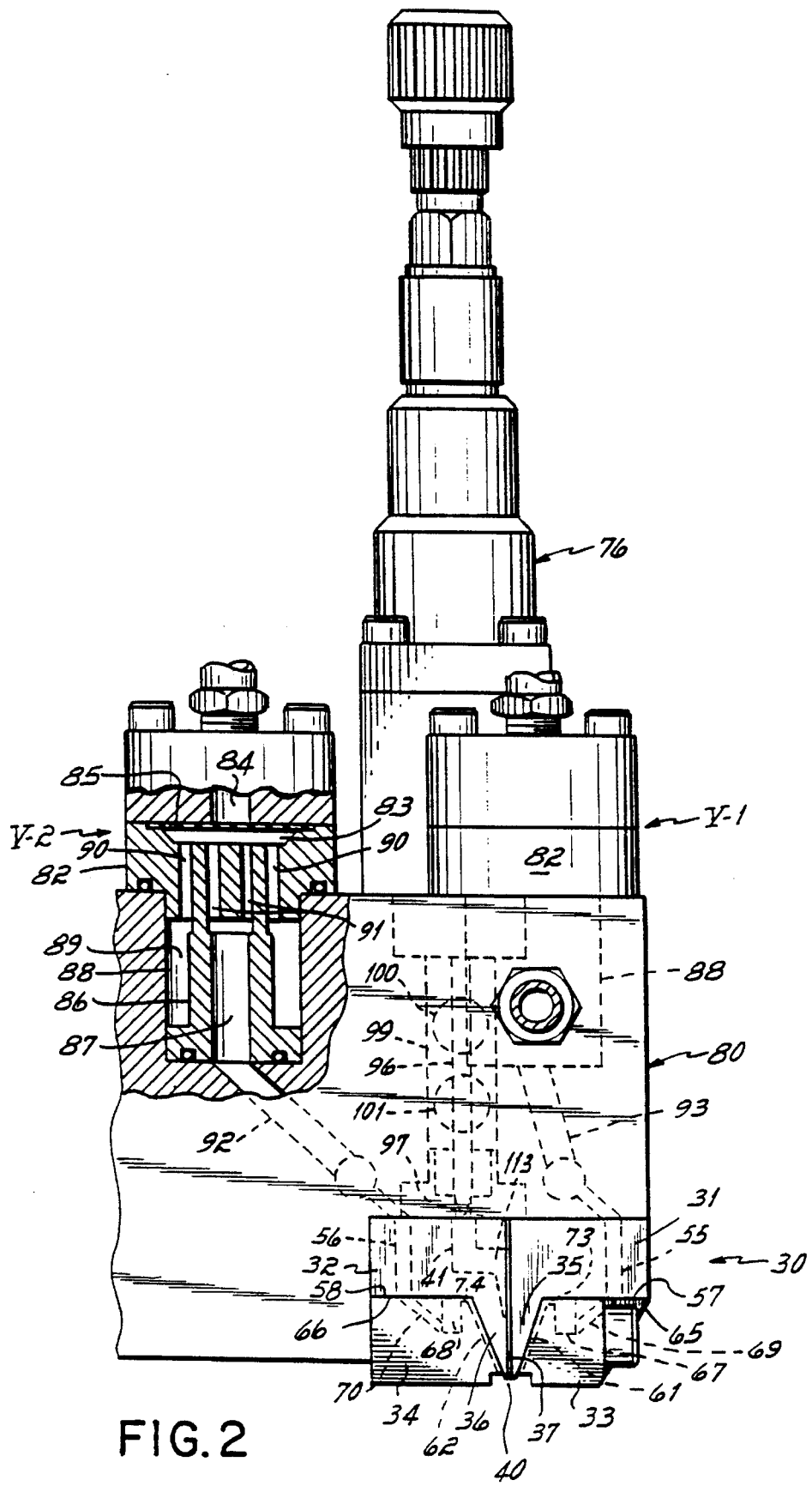
FIG. 2 is an elevational side view in partial cross section of a slot nozzle coater according to the invention.
Figure 3:
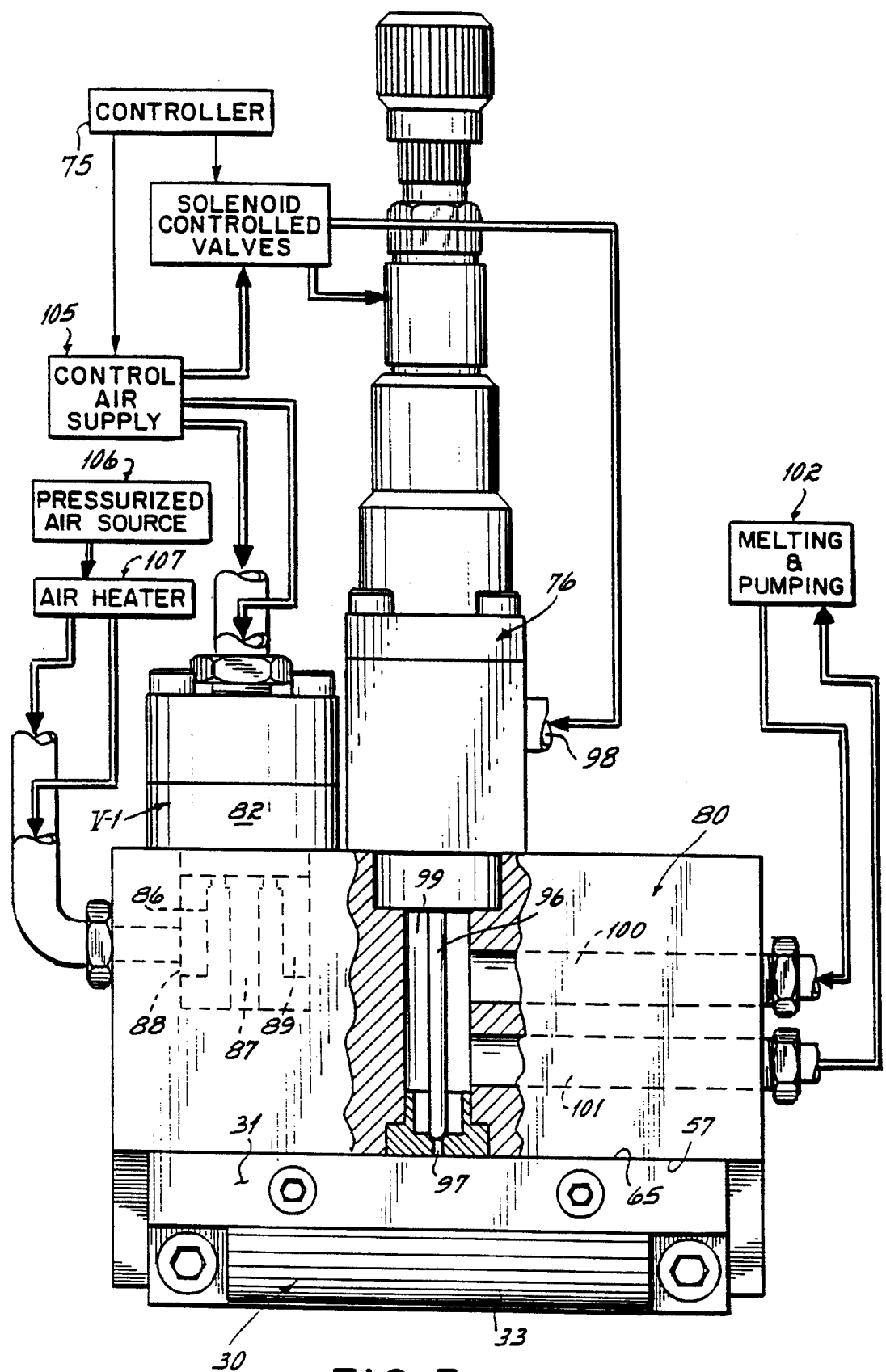
FIG. 3 is an elevational front view in partial cross-section of the apparatus of FIG. 2, illustrating diagrammatically control and flow features of the invention.

Turning now to FIGS. 2 and 3, there is shown more of the overall extrusion apparatus according to the invention. As shown in FIG. 2, the die means 30 is interconnected with air valves V-1, V-2 and hot melt valve 76, each of which is interconnected with an extrusion body 80 which operationally interconnects the air and hot melt valves with the die means 30.

For clarity, a portion of the air valve V-2 is shown in partial cross section in FIG. 2. Since the valves V-1 and V-2 are identical, only valve V-2 will be described. Such air valves are manufactured and distributed by Nordson Corporation through Nordson Engineering, Luneburg, Germany, under part no. 265701. Any other suitable air valve can be used.

Valve V-2 comprises a valve body 82 defining a valve chamber 83 and a control chamber 84, the two chambers being separated by the diaphragm 85. An extension 86 having a bore 87 extending therethrough depends from the valve body 82 and extends into the bore 88 of extrusion body 80 to form an annular chamber 89 therewith. Chamber 89 is interconnected with an annular passageway 90 in the valve body 82, which interconnects with the chamber 83. An annular chamber 91 is also defined in the valve body 82 and interconnects with the chamber 83. When control air is directed into chamber 84, the diaphragm 85 is pushed downwardly to seal off the annular passageway 90 from the annular chamber 91. On the other hand, when pressure is decreased in the control chamber 84, the diaphragm moves upwardly to the position shown in FIG. 3. Air in the inlet annular chamber 89, which is heated and under pressure, communicates through the annular passageways 90 through the chamber 83 and the annular chamber 91, into the outlet bore 87. Outlet bore 87 is connected through a passageway 92 to the air passageway 56 in the upper die half 32, as shown in detail in FIG. 1, where the air from there can move to the plenum 68 and into the air slot 62.

In like manner, the air valve V-1 is operable to selectively supply air to the air passageway 93 in the extrusion body 80 and from there to the air passageway 55 in the upper die half 31. Air moves through that passageway 55 into the plenum 67 and from there to the air slot 61.

The hot melt valve 76 can be any suitable hot melt valve which can be selectively controlled to initiate and to cut off the flow of coating material, such as hot melt adhesive, to the die means 30. One such suitable valve is balanced valve model no. EP51 produced by Nordson Corporation of Westlake, Ohio. Such valve minimizes significant change in pressures when the valve is switched between its opened and closed positions. The valve 76 has a stem 96 seated over a port 97. When control air is supplied to an inlet 98, the stem 96 is lifted to permit hot melt adhesive in a chamber 99 to flow through the port 97 and into the hot melt passageway 41 of the upper die half 32. Hot melt adhesive is introduced into the chamber 99 through hot melt inlet 100. A hot melt outlet 101 is also interconnected with the chamber 99 to receive pressurized hot melt adhesive when the stem 96 is seated on port 97.

Any suitable apparatus can be utilized for melting and pumping hot melt adhesive to the valve 76. Such apparatus is shown diagrammatically at 102. While any suitable apparatus could be utilized, one particular form of apparatus which is suitable is the model HM640 applicator, manufactured by Nordson Corporation of Westlake, Ohio.

It will be appreciated that the coating material may be precisely delivered to the heads or nozzles by one or more material metering means such as metering gear pumps. A single pump could feed a manifold for all the heads or nozzles or a separate metering gear pump could be used for each head or nozzle, or for a group of nozzles of less than all nozzles. This precise delivery permits accuracy in the material delivery so that accurate basis weight coatings can be provided for varying substrate speeds, for example. Any suitable form of metering feeds can be utilized. For example, U.S. Pat. Nos. 4,983,109 and 4,891,249, expressly incorporated herein by reference, disclose metering means for hot melt adhesives.

FIG. 3 illustrates diagrammatically the various control inputs to the valves 76 and V-1. As shown in FIG. 3, the controller 75 is interconnected to a control air supply 105 for supplying control air to the valves V-1 and V-2. A pressurized air source 106 is interconnected to an air heater 107 which supplies process air to the valves V-1 and V-2 for transmission to the respective air slots 61, 62, as described above. When the respective valves V-1 and V-2 are opened, controller 75 is also interconnected to the control air supply for supplying control air through closed and opened solenoid control valves (shown in FIG. 3) to open and close the hot melt valve 76.

Referring now more particularly to FIG. 1 and the details of the die means 30 as shown in FIG. 4, it will be appreciated that the plenums 67 and 68 in the air blocks 33, 34 communicate with the lower surfaces 73A and 74A, respectively, of the air passageways 73 and 74 as previously described, and air emanating from the upper portion of the plenums 67 and 68 moves through the passageways 73 and 74 and then downwardly through the respective air slots 61, 62.

Turning now to the so-called "coat hanger" portion 42 of the upper die half 32, and with reference to FIG. 4, it will be appreciated that "coat hanger" dies are known in general. For example, one coat hanger-type die for handling hot melt adhesive is disclosed in U.S. Pat. No. 4,687,137, expressly incorporated herein by reference. The difference in that structure is that it serves a plurality of die outlets, and not a continuous extrusion slot die as noted herein. While such a die could be used herein, nevertheless, the present die means 30 incorporates a "coat hanger" portion 42 having an arcuate slot or groove of increasingly shallow dimension 110 communicating with an incline surface 111. Surface 111 is inclined such that its lower portion, where it meets bottom surface 112, is closer to the plane of the face 39 than is the upper portion. It will also be appreciated that slot 110 is of decreasing depth as its distance from port 113 continues until it flows unbroken in surface 111. The arcuate slot 110 of decreasing depth is fed by the hot melt port 113, which is interconnected to the hot melt passageway 41. In use, when hot melt is supplied at pressure to the passageway 41, it exudes through the port 113 into the arcuate slot 110 and from there flows over the surface 111 and spreads out throughout the relieved coat hanger shaped portion 42 of the die face 39 and the side of the shim 45 which is juxtaposed to the face 39 of the die half 32.

It will be appreciated that the slots 47 of shim 45 have upper ends which communicate with the lower portion of the coat hanger die area 42, just above the surface 112 thereof, so that hot melt adhesive or other coating material can flow into the slots 47 and then downwardly to the extrusion outlet 40. In this manner, the coating material is spread throughout the coat hanger portion 42 and across each of the upper ends of the slots 47 of the shim 45 at significantly equal pressures, so that coating material can move through the extrusion slot 37 within the slots 47 of the shim 45 at relatively equal pressures.

As illustrated diagrammatically in FIG. 6, the material exudes through the slots 47 and then outwardly of the extrusion outlet 40.

Considering the advantages of the segmented shim 45, it will be appreciated that the width of the slot 47 between projections 46 is preferably about twice the thickness of the shim. The thickness of one shim 45 may be about 0.004" while the slot width, i.e. from one projection 46 across to the next projection 46, is about 0.008". In another shim 45, for example, the shim thickness is about 0.008" while the segmented slot width between juxtaposed projections is about 0.016"

Accordingly, the overall slot thickness between die faces 38, 39 can be doubled while the die still produces the same basis weight coating as a prior slot die where the die slot is not segmented, as in this invention. Thus in a prior slot die where a slot thickness of 0.002" was needed for a small basis weight coating, the present invention can obtain the same basis weight coating with a slot thickness of 0.004", or doubled. Thus, the slot die according to the invention could pass a potentially clogging particle of 0.003" while the prior continuous slot die would not (for the same basis weight coating to be produced).

While the ratio of the shim thickness to the shim slot width is preferably about 2 to 1, this ratio can be varied to produce varying coating thicknesses.

It will be appreciated that the width and thickness parameters of the shims 45, 45a and their components can widely vary. The parameters may vary due to the basis weight of coating per square meter desired, the cohesiveness desired, the coating material viscosity or other factors.

In order to provide further description of one form of coat hanger portion 42, the surface 112 from face 39 back to surface 111 is about 0.020" wide. The tops of slots 47 are about 0.050" when the shim is operably disposed between faces 38, 39. The groove 110 at its deepest depth from face 39 is about 0.125" from face 39. The surface 111 at its top area is about 1/16" deep from face 111 and about 0.020" back from surface 39 at its bottom. The coat hanger width across face 39 is about 38 mm.

It will also be appreciated that the overall die head could be expanded in length with, for example, open areas in the shim so that a wide, unbroken coating of greater than 38 mm could be obtained. In this regard, several nozzles, each about 38 mm wide, could be closely spaced in adjacent fashion with very narrow lands therebetween to produce a wide pervious or impervious film as disclosed herein.

Turning now to the use of the apparatus described above, for the application of coatings to defined predetermined or discrete substrates, it will be appreciated that the apparatus is capable of impinging hot air from the slots 61 and 62 on each side of the coating material exuding from the extrusion outlet 40. The impinging air engages and shreds the energizing expanse of coating material into discrete micro-denier fibers. Edge control is uniform and the density of the pattern can range from 25% open or fibrous to 0% open, i.e. a non-porous film. The parameters are selected depending on the application to which the coatings are to be applied. The controller 75 is operational to start and stop the application of air to the extruded coating material at different times and/or intervals compared to the starting and stopping of the delivery of hot melt adhesive to the extrusion outlet 40.

For example, in one preferred method of operation, the flow of air through the slots 61, 62 is started a short time prior to the time when the valve 76 is operated to initiate the delivery of coating material into the slot 37 and out through the outlet 40. The air is continued for the coating deposition, shredding or fiberizing the extruding material and carrying it to or spraying it on a substrate. At the end of the deposition period, the valve 76 is first operated to cease the extrusion of coating material through the outlet 40. After a short delay, the flow of air through the slot 61 and 62 is stopped. While the amount of delay in such an operation will vary, depending upon the properties of the hot melt, such time period generally will preferably be on the order of micro seconds. One example would be, for example, 1700 micro seconds between the start up of the air and the start up of the extrusion of the hot melt material, and 2100 micro seconds between the stopping of the hot melt material and the stopping of the air. Continuation of the air flow much beyond this time might serve to pull off remaining hot melt adhesive at the extrusion outlet and cause stringing of the deposited coating.

Moreover, it will also be appreciated that the invention contemplates the selective applications of air flow through either slot 61 or 62 individually or together during the deposition period, particularly to more accurately define the initial and ending contact position of the deposited coating on the substrate. One such mode of operation is illustrated in FIG. 5, where the apparatus is utilized, for example, to apply a discrete coating to the spine of a book so that a cover can be applied or laminated thereto.

In FIG. 5, a book having a spine with no adhesive thereon is shown at the left hand side of the figure at position B-1. As illustrated at B-1, air flow has been initiated through slot 61 but there is no coating material being extruded through the slot 37 and no air flow has started through the air slot 62. Moving to the book at the position B-2, it will be appreciated that the hot melt flow has started and that it is impinged by air flowing through slot 61. Since the air flowing through slot 61 moves downwardly in a general right to left direction as shown in FIG. 5, it will be appreciated that the coating material does not string down the side of the book pages but is applied directly to the edge of the spine of the book with no stringing. Thereafter, and for most of the remainder of the coating operation, as shown in book position B-3, air flow is initiated through the slot 62. At the end of the coating operation, the air flowing through slot 61 is terminated just before termination of the extrusion of the coating material (position B-4). Then, as shown in position B-5, the coating material flow has ceased, while the air flowing through slot 62 continues for a short time period thereafter. This operation, when used in book binding, for example, would ensure that the adhesive will not string down the leading or rear sides or ends of the book.

Accordingly, with respect to FIG. 5, the lag air is started first and stopped first and the lead air, that is, with respect to the machine direction of the application as shown in FIG. 5, is started after the extrusion of the coating material and stopped after the coating material extrusion has ceased. In this way, the air angling onto the coating material does not blow it in strings over the edges of the book, as would be undesirable and yet the cut-off and cut-on edges of the coating material are maintained in sharp, square fashion on the spine of the book.

It will also be appreciated that the invention is useful in many applications. In one particular application, the invention is useful in applying adhesive to components of a consumable product, such as a disposable diaper made up from impervious synthetic films, non-woven absorbent material or "fluff" and elastic for waist and leg area gatherings.

Figure 8:
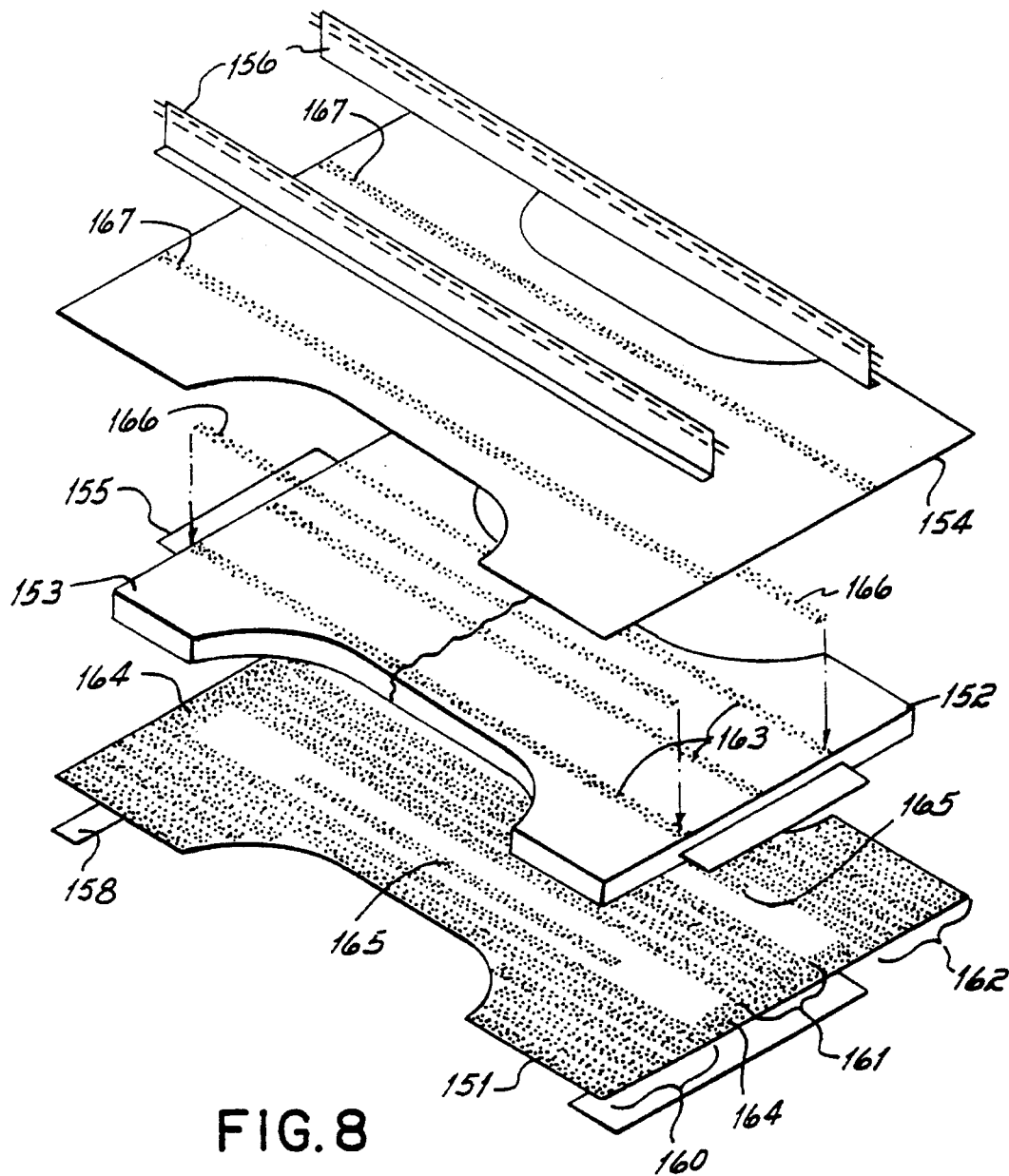
FIG. 8 is a perspective exploded view of a disposable diaper illustrating use of the invention in the manufacture of consumable or disposable products.

In FIG. 8, a disposable diaper 150 is illustrated in exploded view, showing its typical components. The diaper includes an impervious outer sheet 151, an absorbent non-woven or "fluff" layer 152, a "fluff" tissue cover 153, a pervious cover sheet 154, elastic waist bands 155, elongated elastic strands 156, 157, and fastening tapes 158.

Lines of adhesive are applied by the apparatus described herein, in either fibrous or impervious form, to hold the diaper components together. For example, lamination of the outer sheet 151 to the tissue covered "fluff" 152 is accomplished by application of adhesive stripes or bands at 160, 161 and 162. Adhesive bands 163 are applied to stabilize the "fluff" 152 to tissue 153. Adhesive bands 164 are applied for securing elastic waist bands to the diaper 150. Adhesive bands 165 are applied over elastic strands in the leg and interior areas. Adhesive bands 166 are applied to adhere the non-woven tissue covered "fluff" 152 to the cover sheet 154. Adhesive bands 167 are applied to hold the elastic strands 156 to cover sheet 154 and for end tack at the leg gather area of the diaper.

As shown in FIG. 8, the adhesive bands or stripes 160–167 are varied in width. They can be applied by apparatus as disclosed herein oriented along a diaper manufacturing line at predetermined positions as necessary, with sharp and square side and leading and trailing edges.

The invention is believed useful in many other applications and with a wide range of coating materials of different viscosities, as shown by the following two examples.

ADHESIVE NO. 1

This adhesive had the following viscosities at the following temperatures:

41,700 centipoise at 275 degrees F.

25,050 centipoise at 350 degrees F.

16,575 centipoise at 325 degrees F.

11,325 centipoise at 350 degrees F.

Operating temperature was at 180 degrees C. With a 0.1 millimeter thick shim in the head, the supply pressure was 20 BAR, the return pressure of the adhesive was 21 BAR, and the air pressure was 1.5 BAR. The air was turned on 2 millimeters of substrate travel before the adhesive and turned off 2 millimeters of substrate travel after the adhesive. Substrate line speed is about 150 meters/minute. This corresponds to the delay times of about 800 micro seconds. At these settings, the cut-on and cut-off were square and sharp and a coating weight was produced of 5 grams per square meter of uniform thickness.

ADHESIVE NO. 2

This adhesive had the following viscosities:

5,700 centipoise at 250 degrees F.

2,600 centipoise at 275 degrees F.

1,400 centipoise at 300 degrees F.

800 centipoise at 325 degrees F.

550 centipoise at 350 degrees F.

Operating temperature was 300 degrees F. Coating weight was 15 grams per square meter. Cut-on and cut-off were square and sharp with no stringing.

It is important in both these examples and other applications that the hot melt supply pressure and return pressure be maintained in a relationship, such that the differences of the two pressures are not more than 1 BAR.

Figure 7:
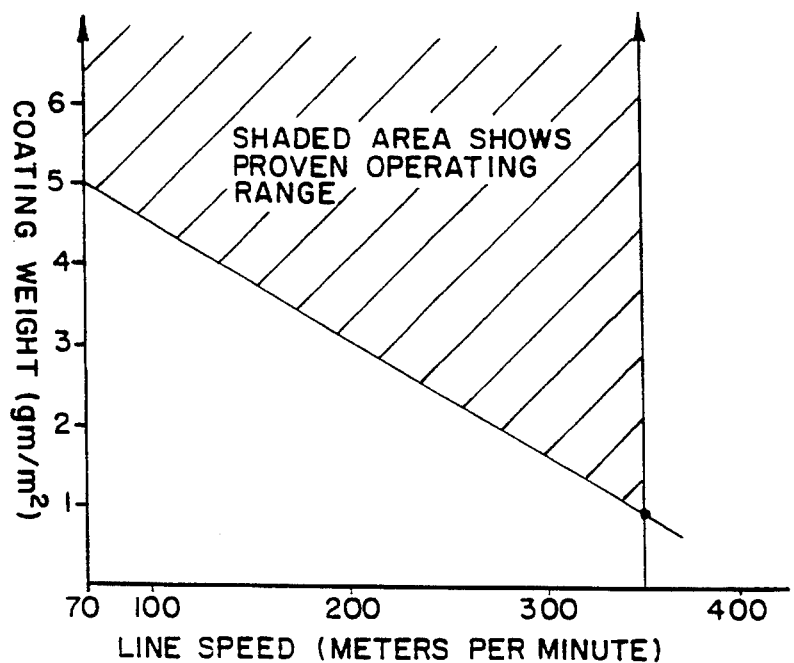
FIG. 7 is a graph illustrating coating weight applied vs. substrate line speed for a coater according to the invention.

In addition, it is believed, based on current information, that a minimum flow rate is required to produce a uniform pattern with square and sharp cut-ons and cut-offs. For example, in connection with a 38 millimeter wide pattern, it is possible to get down to at least 1 gram per square meter of coating weight at approximately 350 meters per minute of line speed. The graph in FIG. 7 illustrates coating weights which have been obtained with a 38 millimeter wide pattern deposited on a substrate moving at about from 70 meters per minute to about 350 meters per minute, with the shaded area of the graph (FIG. 7) illustrating the proven operating ranges.

As noted above, coatings are produced in varying weights. Such coatings can be varied from 0% open or impervious to about 25% open or porous.

It will be appreciated that various sizes, spacings, pressures and selections of materials can be utilized. Thus, for example, the hot melt might be started at 2 mm of substrate movement after air start up, and the air flow stopped at 5 mm of substrate movement beyond extrusion shut off, for substrate speeds of about 70 meters/minute.

It will also be appreciated that the particular coating pattern produced by the apparatus and methods described above can either be porous or impervious and that the coating patterns are preferably produced in a discrete fashion on discrete substrates, for example, with good, square, sharp cut-on and cut-off and no stringing for the leading or trailing edges of the pattern, while at the same time, the sides of the pattern deposited are also parallel and sharp.

Figure 9:
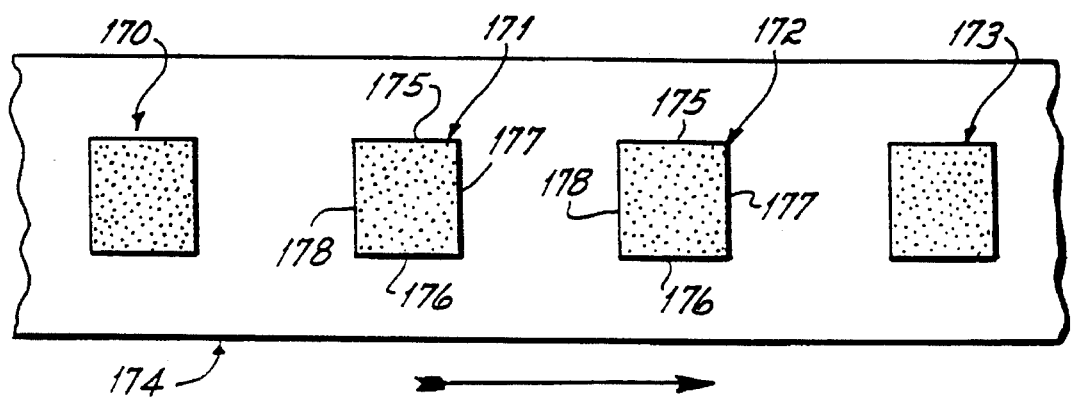
FIG. 9 illustrates the sharp and square patterns of coatings attained by the invention.

FIG. 9 illustrates the sharp edged, square coating patterns attainable with the invention. In FIG. 9, discrete adhesive coatings 170–173 have been applied by the invention to a substrate 174. Each discrete coating has two sharply defined side edges 175, 176, a sharply defined leading edge 177, and a sharply defined trailing edge 178. Sides 175, 176 are square to leading and trailing edges 177, 178. There is substantially no stringing.

Accordingly, the invention provides for intermittent noncontact coating operation with sharp, square-edged patterns and no stringing for a variety of applications, including lamination of the substrate to which the patterns are applied to some other substrate or component. These and other modifications and advantages of the invention will become readily apparent to those of ordinary skill in the art without departing from the scope hereof, and the applicant intends to be bound only by the claims appended hereto.

We claim:

1. Apparatus for producing a coating for noncontact application to a substrate, said apparatus comprising:

a slot nozzle having an elongated slot outlet through which a coating material can be extruded for deposition on a substrate spaced from said slot nozzle;

at least one elongated air slot proximate said slot outlet for impinging at least one air flow onto a coating material exuding from said slot outlet; and means for starting the flow of air prior to extrusion of coating material from said slot outlet said flow of air producing a discrete coating which when deposited on a substrate has square, sharp leading and trailing edges.

2. Apparatus as in claim 1 further including means for stopping the flow of air after extrusion of coating material has ceased.

3. Apparatus as in claim 2 including at least two air slots, one proximate each side of said slot outlet for impinging air therefrom onto coating material exuding from said slot outlet.

4. Apparatus as in claim 3 further including means for delaying impinging air from one of said air slots until after coating material exudes from said slot outlet and for continuing flow of air from said one slot until after extrusion of said coating material has ceased.

5. Apparatus as in claim 4 further including means for initiating flow of air from the other air slot before coating material is extruded and for ceasing flow of air from said other air slot before extrusion of said coating material ceases.

6. Apparatus as in claim 1 wherein said slot nozzle is disposed in a slot nozzle die comprising:

die halves defining an extrusion slot therebetween, said die halves having tapered projections with parallel inward facing surfaces forming said extrusion slot and tapered outer walls respectively partially defining inward surfaces of two air channels disposed at an angle with respect to said extrusion slot;

two air blocks, each having a tapered surface juxtaposed in operative disposition near one of said tapered outer walls such that one of said air channels is formed therebetween;

an air plenum in each said die block;

an air passage in each air bock interconnecting and upper portion of each said plenum with a respective air channel; and an air passage in each air block for feeding air to a lower portion of each said plenum.

7. Apparatus as in claim 6, including an air passage in each die half, each die half air passage operationally interconnected with one of said air passages in said air blocks for feeding air to said plenum therein.

8. Apparatus as in claim 6 wherein said air passages for feeding air channel are defined by juxtaposed surfaces of said respective die halves and air blocks.

9. Apparatus as in claim 6 wherein said respective air plenums are defined by juxtaposed surfaces of said respective die halves and air blocks.

10. Apparatus as in claim 6 wherein said extrusion slot has an outlet and further including a shim disposed between said die halves.

11. Apparatus for adhering together components of disposable diapers each having an impervious outer sheet, an absorbent layer and elastic members for waist and leg holes, said apparatus having:

a slot nozzle having an elongated slot outlet through which a coating material can be extruded;

at least one elongated air slot proximate said slot outlet for impinging at least one air stream onto an adhesive coating material exuding from said slot outlet prior to deposition on one of said components; and means for starting the flow of air prior to extrusion of adhesive coating material from said slot outlet wherein said coating when deposited on one of said components has at least one square sharp edge.

12. In apparatus for laminating two components together, the combination of:

a slot nozzle having an elongated slot outlet through which an adhesive coating material can be extruded onto one component for receiving another component in adhesive relation thereto, said slot nozzle being spaced from said one component;

at least one elongated air slot proximate said slot outlet for impinging at least one air flow onto an adhesive coating material exuding from said slot outlet prior to contacting said one component; and means for starting the flow of air prior to extrusion of adhesive coating material from said slot outlet wherein said adhesive coating material, when deposited, has at least one square, sharp edge.

13. An apparatus for producing a coating for application to a substrate, the apparatus comprising:

a slot nozzle having an elongated slot outlet through which a coating material can be extruded;

at least one air slot proximate the slot outlet, the one air slot impinging at least one process air stream onto the coating material exuding from the slot outlet to shred the material into fibers for deposition onto the substrate;

a diaphragm having
one side in contact with control air for operating the air valve, and
an opposite side in selective contact with at least one of the inlet and the outlet ports, the diaphragm being responsive to the control air to selectively operatively open the ports into fluid communication with the each other, thereby initiating a flow of process air through the ports to the one air slot and operatively close the ports from fluid communication with each other, thereby terminating the flow of process air to the one air slot.

14. The apparatus of claim 13 further comprising:

a second air slot proximate the slot outlet, the second air slot impinging a second process air stream onto the coating material exuding from the slot outlet;

a second diaphragm operated process air valve, the air valve having
a second inlet port in fluid communication with a source of process air,
a second outlet port in fluid communication with the second air slot, and
a diaphragm having
one side in contact with control air for operating the air valve, and
an opposite side in selective contact with at least one of the second inlet and second outlet ports, the diaphragm being responsive to the control air to selectively operatively open the second inlet and second outlet ports into fluid communication with the each other, thereby initiating a flow of process air through the second inlet and second outlet ports to the second air slot and, operatively close the second inlet and second outlet ports from fluid communication with each other, thereby terminating the flow of process air to the second air slot.

15. An apparatus for producing a coating for application to a substrate, the apparatus comprising:

a slot nozzle having an elongated slot outlet through which a coating material can be extruded;

at least one air slot proximate the slot outlet for impinging at least one air stream onto a coating material exuding from the slot outlet;

an air valve having
an inlet chamber connected to a source of process air;
an outlet chamber connected to air slots of a die;
a valve chamber connecting the inlet and outlet chambers;
a control chamber connected to a source of control air;
a diaphragm located between the inlet chamber and the outlet chamber and separating the control air from the process air, the diaphragm having
a first position providing fluid communication between the inlet and outlet chambers through the valve chamber, thereby opening the air valve and supplying process air to the air slots of the die, and
a second position in response to control air of a predetermined pressure being introduced into the control chamber, the second position blocking fluid communication between the inlet and outlet chambers through the valve chamber, thereby closing the air valve and stopping the supply of process air to the air slots of the die.

16. An apparatus for applying a coating having sharp, square cut-on and cut-off edges to a substrate, the apparatus including a noncontact die having a slot nozzle with an elongated slot outlet through which a coating material can be extruded and a first air slot proximate the slot outlet for impinging at least one air stream onto a coating material exuding from the slot outlet, the apparatus further comprising an air valve including an inlet connected to a source of process air;

an outlet connected to the first air slot;

a valve chamber selectively providing fluid communication between the inlet and the outlet;

a control chamber connected to a source of control air;

a diaphragm located between the control chamber and the valve chamber and separating the control air from the process air, the diaphragm being selectively movable between a first position in response to control air of a first predetermined pressure in the control chamber, the first position providing fluid communication between the inlet and outlet through the valve chamber, thereby supplying process air to the first air slot, and a second position in response to control air of a second predetermined pressure in the control chamber, the second position blocking fluid communication between the inlet and outlet, thereby stopping the supply of process air to the first air slot.

17. An apparatus for applying a coating to a substrate, the apparatus including a noncontact die having a slot nozzle with an elongated slot outlet through which a coating material is extruded and at least one air slot proximate the slot outlet for impinging at least one air stream onto a coating material exuding from the slot outlet to engage and shred the coating material into discrete fibers, the apparatus further comprising an air valve including an inlet connected to a source of process air;

an outlet connected to the first air slot;

a valve chamber selectively providing fluid communication between the inlet and the outlet;

a control chamber connected to a source of control air;

a diaphragm located between the control chamber and the valve chamber and separating the control air from the process air, the diaphragm being selectively movable between a first position in response to control air of a first predetermined pressure in the control chamber, the first position providing fluid communication between the inlet and outlet through the valve chamber, thereby supplying process air to the first air slot, and a second position in response to control air of a second predetermined pressure in the control chamber, the second position blocking fluid communication between the inlet and outlet, thereby stopping the supply of process air to the first air slot.

18. The apparatus of claim 17 further having a second air slot, one of the fist and second air slots being proximate each side of the slot outlet for impinging air from the air slots onto both sides of the coating material exuding from the slot outlet, the apparatus further comprising a second air valve including a second inlet connected to a source of process air;

a second outlet connected to the second air slot;

a second valve chamber selectively providing fluid communication between the inlet and the outlet of the second valve;

a second control chamber connected to the source of control air;

a second diaphragm located between the second control chamber and the second valve chamber and separating the control air from the process air within the second valve, the second diaphragm being selectively movable between a first position in response to control air of a first predetermined pressure in the second control chamber, the first position providing fluid communication between the second inlet and the second outlet through the second valve chamber, thereby supplying process air to the second air slot, and a second position in response to control air of a second predetermined pressure in the second control chamber, the second position blocking fluid communication between the second inlet and the second outlet, thereby stopping the supply of process air to the second air slot.

19. An apparatus for producing a coating for application onto a diaper component, the apparatus comprising:

a slot nozzle having an elongated slot outlet through which a coating material can be extruded;

at least one air slot proximate the slot outlet, the one air slot impinging at least one process air stream onto the coating material exuding from the slot outlet to shred the material into fibers for deposition onto the diaper component;

a diaphragm operated process air valve, the air valve having an inlet port in fluid communication with a source of process air, an outlet port in fluid communication with the one air slot, and a diaphragm having one side in contact with control air for operating the air valve, and an opposite side in selective contact with at least one of the inlet and the outlet ports, the diaphragm being responsive to the control air to selectively operatively open the ports into fluid communication with the each other, thereby initiating a flow of process air through the ports to the one air slot and, operatively close the ports from fluid communication with each other, thereby terminating the flow of process air to the one air slot.

20. A method of applying a coating material to a component of a disposable diaper comprising the steps of:

extruding a coating material from an elongated slot nozzle;

selectively opening and closing a diaphragm operated valve to control the flow of process air from a source of process air to an air slot proximate the slot nozzle;

impinging air through the air slot onto extruding coating material to produce discrete fibers of coating material; and then depositing the discrete fibers of coating material onto the component of the diaper.

\* \* \* \* \*